US012704463B2

(12) United States Patent
Hu et al.

(10) Patent No.: US 12,704,463 B2
(45) Date of Patent: Aug. 11, 2026

(54) CIRCUIT ADAPTIVE ZERO-VOLTAGE SWITCHING CONTROL METHOD BASED ON SWITCH TRANSISTOR ELECTROLUMINESCENCE, ELECTROLUMINESCENCE DETECTION CIRCUIT, AND ASSEMBLY STRUCTURE THEREOF

(71) Applicant: NANJING EFFICIENT POWER FOR INTELLIGENT COMPUTING TECHNOLOGIES CO. LTD., Nanjing (CN)

(72) Inventors: Borong Hu, Nanjing (CN); Teng Long, Beijing (CN); Yunlei Jiang, Nanjing (CN)

(73) Assignee: NANJING EFFICIENT POWER FOR INTELLIGENT COMPUTING TECHNOLOGIES CO. LTD., Nanjing (CN)

( * ) Notice: Subject to any disclaimer, the term of this patent is extended or adjusted under 35 U.S.C. 154(b) by 232 days.

(21) Appl. No.: 18/750,534

(22) Filed: Jun. 21, 2024

(65) Prior Publication Data

US 2025/0044233 A1 Feb. 6, 2025

(30) Foreign Application Priority Data

Jun. 21, 2023 (CN) ........................ 202310746315.X

(51) Int. Cl.
*G01N 21/67* (2006.01)
*H03K 17/687* (2006.01)
*H05K 1/182* (2026.01)

(52) U.S. Cl.
CPC ........... *G01N 21/67* (2013.01); *H03K 17/687* (2013.01); *H05K 1/182* (2013.01)

(58) Field of Classification Search
CPC ...... G01N 21/67; G01N 21/66; H03K 17/687; H05K 1/182
See application file for complete search history.

(56) References Cited

U.S. PATENT DOCUMENTS

2014/0312868 A1* 10/2014 Dally .................. H02M 3/1588 323/282
2020/0244236 A1* 7/2020 Hwang .................. H02J 50/12

* cited by examiner

*Primary Examiner* — Seung C Sohn
(74) *Attorney, Agent, or Firm* — Oliff PLC

(57) ABSTRACT

A circuit adaptive zero-voltage switching control method based on switch transistor electroluminescence, an electroluminescence detection circuit, and an assembly structure thereof. Switching status is detected based on an electroluminescence effect, and gate switching of a device is autonomously controlled, implementing adaptive zero-voltage switching operation under both steady-state and transient-state loading conditions. Two signal receiving and amplifying assemblies are used in a differential mode in the detection circuit, to increase a signal-to-noise ratio of the electroluminescence detection circuit with an ultra-high amplification gain. A first silicon photomultiplier of a first signal receiving and amplifying assembly is close to a to-be-detected switch transistor die in a power module of an embedded printed circuit board and can sense electroluminescence in the switch transistor die. A second silicon photomultiplier of a second signal receiving and amplifying assembly is outside an electroluminescence transmission region to eliminate potential noise caused by ambient light and electromagnetic interference.

13 Claims, 4 Drawing Sheets

CIRCUIT ADAPTIVE ZERO-VOLTAGE SWITCHING CONTROL METHOD BASED ON SWITCH TRANSISTOR ELECTROLUMINESCENCE, ELECTROLUMINESCENCE DETECTION CIRCUIT, AND ASSEMBLY STRUCTURE THEREOF

TECHNICAL FIELD

The present invention relates to a circuit adaptive zero-voltage switching control method based on switch transistor electroluminescence, an electroluminescence detection circuit, and an assembly structure thereof.

BACKGROUND

Zero-voltage switching (ZVS) is an effective approach to eliminate large switching losses in converters, especially in operation at high switching frequency. A conventional critical conduction mode (CRM) and an emerging triangular current mode (TCM) or quadrilateral current mode (QCM) can implement zero-voltage switching, but current ripples are increased. For ideal zero-voltage switching, switching status of a semiconductor device should be changed at the instant of zero volts. However, such accurate control is almost unattainable, so an excessive ripple current is inevitable in practice, consequently leading to higher conduction losses.

A zero-voltage switching operation state of a silicon carbide (SiC) half-bridge arm in the triangular current mode (TCM) is shown in FIG. 1A. A practical approach for an upper switch transistor Q1 to implement zero-voltage switching (ZVS) is to overdesign a reverse load current $i_L$, so that an output capacitor (Coss) of the upper switch transistor Q1 can be completely discharged in a transient state ②. However, an excessive reverse current causes a large current ripple and a large current effective value, consequently leading to a significantly increased conduction loss. This also leads to more conduction losses on a body diode during a longer conduction time period, that is, at an instant ③. Theoretically, optimal zero-voltage switching can only be implemented by triggering the upper switch transistor Q1 within an optimal interval from completely discharging the output capacitor (that is, a drain-source voltage Vds is reduced to zero) to reversely charging the output capacitor to an on-state voltage of the body diode (that is, the body diode starts to conduct an additional reverse current), as shown in a final stage of the transient state ②.

However, it is almost impossible to implement optimal zero-voltage switching (ZVS) when the load current continuously changes, because it is still very difficult to accurately detect switching status and correctly calculate a required reverse current. In the related art, a zero-current point is measured through zero-current detection (ZCD), and then a delay is calculated to determine a zero-voltage moment. However, zero-current detection (ZCD) based on electrical signals, for example, measurements by using current sensors, saturable inductors, and drain-source voltages, introduces additional losses and response delays. In addition, these measurements are prone to interference by electromagnetic noise due to close proximity to high dv/dt and di/dt noise sources. In addition, due to non-linear characteristics of the output capacitor Coss and dynamically changing system operating states, analysis and programming of a control algorithm for determining optimal zero-voltage switching time may be very complex and computationally intensive.

SUMMARY

In the present invention, a technical problem to be resolved is to provide an accurate, stable, and common circuit adaptive zero-voltage switching control method.

To resolve the foregoing technical problem, the present invention provides the following technical solutions: Provided is a circuit adaptive zero-voltage switching control method, including: disposing an opto-sensor to detect whether there is electroluminescence in a switch transistor in a circuit; if the disposed opto-sensor does not detect, within a current switching cycle of the circuit, an electroluminescent photon in a body diode (parasitic diode) or an anti-parallel freewheeling diode of the switch transistor that needs to be controlled, reducing switching frequency fsw of the circuit by a variable Δfsw within a next switching cycle, to increase an amplitude of a reverse inductor current, and continuously detecting whether there is electroluminescence; and if there is still no electroluminescence detected, continuously reducing the switching frequency by the variable Δfsw within each next switching cycle, and continuously detecting whether there is electroluminescence, until the disposed opto-sensor detects electroluminescence to reach a steady operating state; or if the disposed opto-sensor detects, within a current switching cycle of the circuit, an electroluminescent photon in a body diode (parasitic diode) or an anti-parallel freewheeling diode of the switch transistor that needs to be controlled, increasing switching frequency fsw by a variable Δfsw within a next switching cycle, and continuously detecting whether there is electroluminescence; and if there is still electroluminescence detected, continuously increasing the switching frequency by the variable Δfsw within each next switching cycle, and continuously detecting whether there is electroluminescence, until the disposed opto-sensor detects no electroluminescence to reach a steady operating state; and repeatedly increasing and reducing the switching frequency of the circuit by the variable Δfsw within successive switching cycles after reaching the steady operating state, where electroluminescence occurs at intervals of the successive switching cycles, for the circuit to reach an adaptive zero-voltage switching operating state;

The variable Δfsw is any value not greater than a difference between switching frequency fsw ii and switching frequency fsw iii; the switching frequency fsw ii is switching frequency when an output capacitor of the switch transistor that needs to be controlled in the circuit is just discharged to zero within dead time, at this time an optimal zero-voltage switching interval starts; and the switching frequency fsw iii is switching frequency when the switch transistor that needs to be controlled in the circuit is reversely charged at both ends to an on-state voltage of the body diode or the anti-parallel diode within the dead time, at this time the optimal zero-voltage switching interval ends.

These solutions have the following beneficial effects:

A body diode (parasitic diode) is inherently provided in a P-N junction between a source and a drain of a silicon carbide (SiC) metal oxide semiconductor field effect transistor (MOSFET). When a capacitor in a depletion layer is reversely charged to an on-state voltage of the body diode (parasitic diode), the body diode (parasitic diode) emits photons under forward-biased conduction, that is, electroluminescence (EL) occurs. The occurrence of electroluminescence accurately marks a moment when the optimal zero-voltage switching interval ends, and provides an opportunity to detect a zero-voltage switching state. In this control method, a gate switching signal of a power semiconductor switch transistor is triggered based on an electroluminescence effect, to implement adaptive zero-voltage switching operation. By the circuit adaptive zero-voltage switching control method, a device can operate alternately in the switching state at any load current, without measuring any electrical parameters or knowing accurate parasitic parameters of the switch transistor.

As Δfsw is set to the difference between the switching frequency at the state ii and the switching frequency at the state iii, it is ensured that a converter can return directly to the optimal zero-voltage switching interval within a next switching cycle. This provides a positive response to an operation condition change.

In the present invention, another technical problem to be resolved is to provide a detection circuit for detecting electroluminescence in a switch transistor in a circuit.

To resolve the foregoing technical problem, the present invention provides the following technical solutions: Provided is a detection circuit for detecting electroluminescence in a switch transistor in a circuit, including a first signal receiving and amplifying assembly and a second signal receiving and amplifying assembly that are disposed in parallel, where the two signal receiving and amplifying assemblies are connected to a differential amplifier, the output of the differential amplifier is connected to a comparator, the output of the comparator is connected to a digital signal processor, the first signal receiving and amplifying assembly includes a first silicon photomultiplier and a first transimpedance amplifier, the second signal receiving and amplifying assembly includes a second silicon photomultiplier and a second transimpedance amplifier, the first signal receiving and amplifying assembly is close to a to-be-detected switch transistor die in a power module of an embedded printed circuit board and is configured to sense electroluminescence, and the second signal receiving and amplifying assembly is located outside an electroluminescence transmission region to eliminate potential noise caused by ambient light and electromagnetic interference (EMI).

As a preferred solution, a threshold voltage and a hysteresis trigger level need to be set for the comparator, and the threshold voltage is higher than a sum of noise caused by all sources on an electroluminescence sensing signal; and the hysteresis trigger level of the comparator is greater than an amplitude of any fluctuation on the electroluminescence sensing signal during operation of the circuit, and a value of the threshold voltage plus the hysteresis trigger level is lower than a value of the electroluminescence sensing signal triggered when there is electroluminescence in the switch transistor in the circuit.

As a preferred solution, a gain of the transimpedance amplifier is $5\times10^4$; and a gain of the differential amplifier is 4.4.

As a preferred solution, the transimpedance amplifier and the differential amplifier are both TI OPA818 with a high bandwidth of 2.7 GHz.

These solutions have the following beneficial effects:

In these solutions, two signal receiving and amplifying assemblies are used in a differential mode, to increase a signal-to-noise ratio (SNR) of the EL detection circuit with an ultra-high amplification gain. The first silicon photomultiplier of the first signal receiving and amplifying assembly is disposed close to the to-be-detected switch transistor die in the power module of the embedded printed circuit board and is configured to sense electroluminescence (EL) in the switch transistor die. The second silicon photomultiplier is located outside the electroluminescence (EL) transmission region to eliminate potential noise caused by ambient light and electromagnetic interference (EMI). The first silicon photomultiplier and the second silicon photomultiplier are connected to respective transimpedance amplifiers (TIAs) to form the first signal receiving and amplifying assembly and the second signal receiving and amplifying assembly respectively, to convert current excitation from the first silicon photomultiplier and the second silicon photomultiplier into a voltage signal. Then, the differential amplifier (diff-amp) eliminates background noise and further increases signal strength.

Through two amplification stages, electroluminescence of the to-be-detected switch transistor die is converted into an analog signal Vsense in a range of a few volts. The comparator is configured to digitize the analog signal Vsense and output a digital signal Vst. The digital signal Vst has a "high" level or a "low" level, indicating that the converter operates in state iv or state iii within the cycle. By using the digital signal Vst, the digital signal processor can adjust the switching frequency within a next switching cycle based on an algorithm.

The silicon photomultiplier has an inherent noise source, namely, a dark count caused by a self-activation mechanism, to generate dark current noise. An increase of a bias voltage can increase photon detection sensitivity but can also increase dark current noise intensity.

A hysteresis trigger function at a level of 25 mV is set for the comparator to eliminate false triggering, so that the overall trigger scheme can provide a steady and quick response.

To obtain a quick response, in the circuit, the transimpedance amplifier and the differential amplifier are both TI OPA818 with a high bandwidth of 2.7 GHz.

In the present invention, another technical problem to be resolved is to provide an embedded printed circuit board power assembly structure for detecting electroluminescence in a switch transistor in a circuit by using the circuit adaptive zero-voltage switching control method.

To resolve the foregoing technical problem, the present invention provides the following technical solutions:

Provided is an embedded printed circuit board power assembly structure for detecting electroluminescence in a switch transistor in a circuit for the circuit adaptive zero-voltage switching control method, including a top printed circuit board and a bottom printed circuit board, where a to-be-detected switch transistor die in the circuit that needs to be controlled by using the circuit adaptive zero-voltage switching control method is disposed between the top printed circuit board and the bottom printed circuit board, a groove is provided at a position that is close to the to-be-detected switch transistor die and that is on each of the top printed circuit board and the bottom printed circuit board, and a printed circuit board of the electroluminescence detection circuit is inserted in the groove, so that the first silicon photomultiplier in the first signal receiving and amplifying assembly faces the to-be-detected switch transistor die.

As a preferred solution, the switch transistor die and the first silicon photomultiplier in the electroluminescence detection circuit are encapsulated in the same power module; and if the switch transistor die is a vertical device, the first silicon photomultiplier is vertically disposed on a side of the switch transistor die; or if the switch transistor die is a lateral device, the first silicon photomultiplier is parallelly disposed on top of the switch transistor die.

These solutions have the following beneficial effects: In the embedded printed circuit board power assembly structure, a sensing printed circuit board of the electroluminescence detection circuit can be quickly mounted and positioned, and the to-be-detected switch transistor die in the circuit that requires adaptive zero-voltage switching (ZVS) control is disposed between the top printed circuit board and the bottom printed circuit board, so that electroluminescence from the to-be-detected switch transistor die can be more accurately captured, thereby ensuring reliable operation of the adaptive zero-voltage switching (ZVS) control circuit.

The switch transistor die and the first silicon photomultiplier in the electroluminescence detection circuit are encapsulated in the same power module, so that light emitting status of a power semiconductor can be further accurately detected, thereby more accurately controlling a reverse valley current required for soft switching.

In the figures, 1—Differential amplifier, 2—Comparator, 3—Digital signal processor, 4—First silicon photomultiplier, 5—First transimpedance amplifier, 6—Second silicon photomultiplier, 7—Second transimpedance amplifier, and 8—To-be-detected switch transistor die; and

9—Top printed circuit board, 10—Bottom printed circuit board, 11—Groove, and 12—Sensing printed circuit board.

DETAILED DESCRIPTION

The following describes in detail specific implementations of the present invention with reference to the accompanying drawings.

Figure 1A:
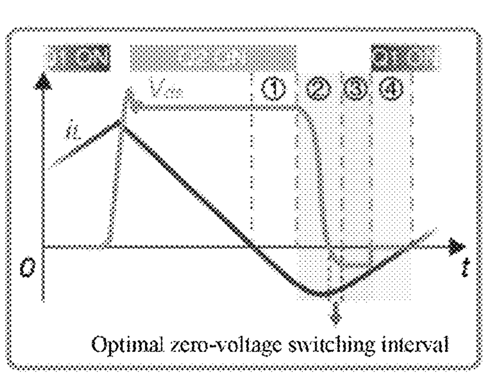
FIG. 1A shows typical TCM zero-voltage switching (ZVS) transient-state waveforms for a half bridge.
Figure 1B:
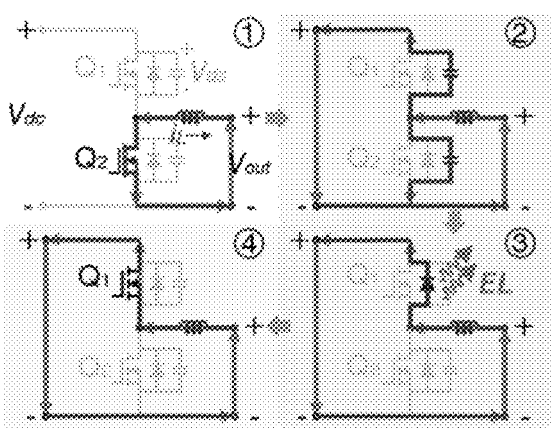
FIG. 1B shows four transient states during a reverse inductor current.
Figure 2:
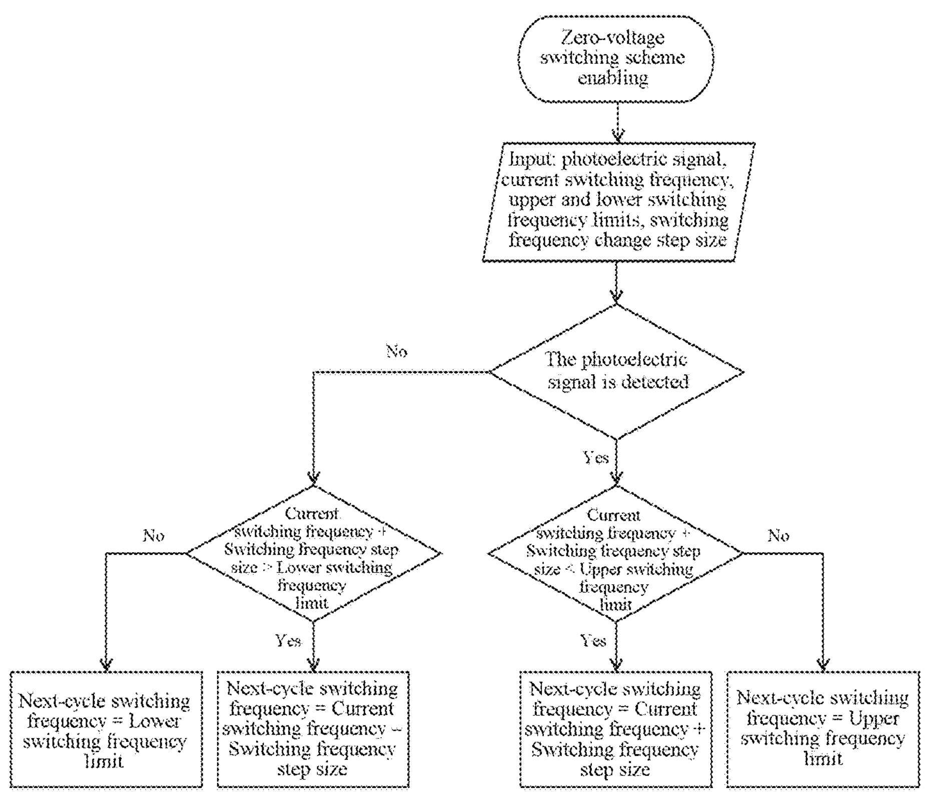
FIG. 2 is a flowchart of a circuit adaptive zero-voltage switching control method.
Figure 3:
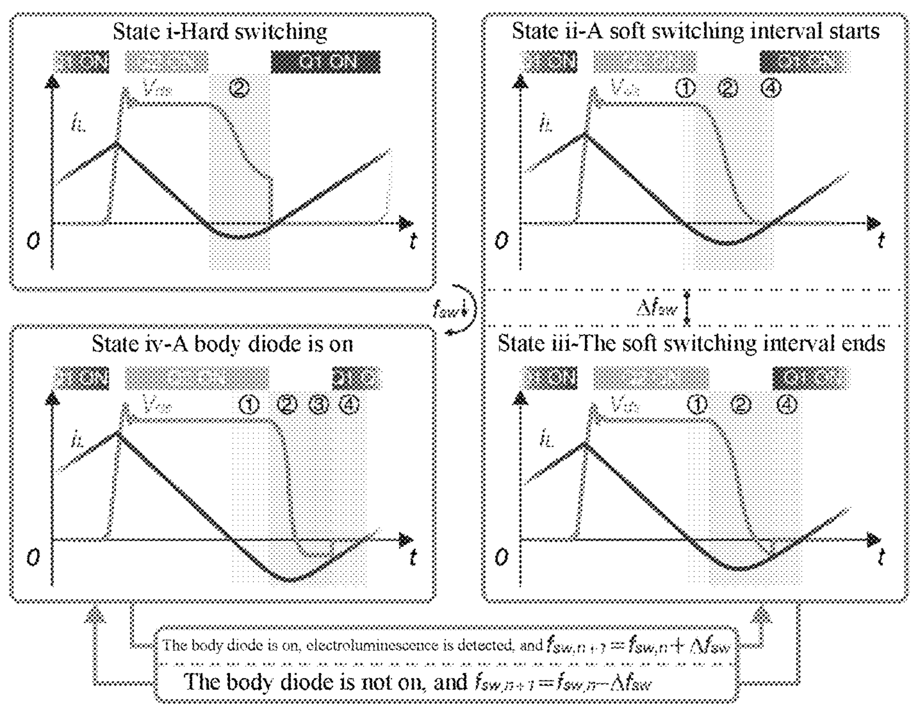
FIG. 3 shows switching states of a buck converter in a typical triangular current mode (TCM).

As shown in FIG. 2 and FIG. 3, a circuit adaptive zero-voltage switching control method includes: disposing an opto-sensor to detect whether there is electroluminescence in a switch transistor in a circuit; if the disposed opto-sensor does not detect, within a current switching cycle of the circuit, an electroluminescent photon in a body diode (parasitic diode) of the switch transistor that needs to be controlled, reducing switching frequency fsw of the circuit by a variable Δfsw within a next switching cycle, to increase an amplitude of a reverse inductor current, and continuously detecting whether there is electroluminescence; and if there is still no electroluminescence detected, continuously reducing the switching frequency by the variable Δfsw within each next switching cycle, and continuously detecting whether there is electroluminescence, until the disposed opto-sensor detects electroluminescence to reach a steady operating state; or if the disposed opto-sensor detects, within a current switching cycle of the circuit, an electroluminescent photon in a body diode (parasitic diode) of the switch transistor that needs to be controlled, increasing switching frequency fsw by a variable Δfsw within a next switching cycle, and continuously detecting whether there is electroluminescence; and if there is still electroluminescence detected, continuously increasing the switching frequency by the variable Δfsw within each next switching cycle, and continuously detecting whether there is electroluminescence, until the disposed opto-sensor detects no electroluminescence to reach a steady operating state; and repeatedly increasing and reducing the switching frequency of the circuit by the variable Δfsw within successive switching cycles after reaching the steady operating state, where electroluminescence occurs at intervals of the successive switching cycles, for the circuit to reach an adaptive zero-voltage switching operating state;

the variable Δfsw is any value not greater than a difference between switching frequency fsw ii and switching frequency fsw iii; the switching frequency fsw ii is switching frequency when an output capacitor of the switch transistor that needs to be controlled in the circuit is just discharged to zero within dead time, at this time an optimal zero-voltage switching interval starts; and the switching frequency fsw iii is switching frequency when the switch transistor that needs to be controlled in the circuit is reversely charged at both ends to an on-state voltage of the body diode or the anti-parallel diode within the dead time, at this time the optimal zero-voltage switching interval ends.

This adaptive zero-voltage switching (ZVS) control algorithm may be extended to other circuits such as Boost, totem pole PFC, and interleaved parallel converters. In addition, using different optical sensors with different detection wavelength ranges, this method may also be applied to Si MOSFET, Si IGBT/FRD, and GaN HEMT, because electroluminescence (EL) still exists in these devices, albeit with different spectra due to different bandwidths.

Figure 4:
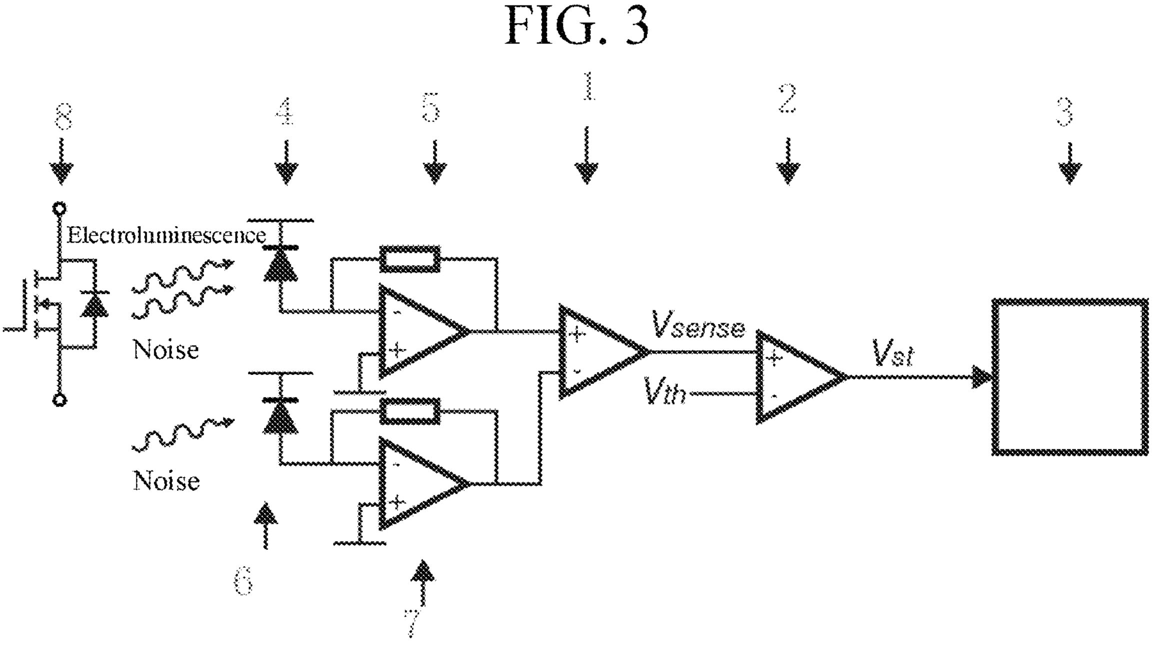
FIG. 4 is a schematic diagram of an electroluminescence detection circuit.

As shown in FIG. 4, a detection circuit for detecting electroluminescence in a switch transistor in a circuit includes a first signal receiving and amplifying assembly and a second signal receiving and amplifying assembly that are disposed in parallel, where the two signal receiving and amplifying assemblies are connected to a differential amplifier, an output of the differential amplifier is connected to a comparator, an output of the comparator is connected to a digital signal processor, the first signal receiving and amplifying assembly includes a first silicon photomultiplier and a first transimpedance amplifier, the second signal receiving and amplifying assembly includes a second silicon photomultiplier and a second transimpedance amplifier, the first signal receiving and amplifying assembly is close to a to-be-detected switch transistor die in a power module of an embedded printed circuit board and is configured to sense electroluminescence, and the second signal receiving and amplifying assembly is located outside an electroluminescence transmission region to eliminate potential noise caused by ambient light and electromagnetic interference (EMI).

A threshold voltage and a hysteresis trigger level need to be set for the comparator, and the threshold voltage is higher than a sum of noise caused by all sources on an electroluminescence sensing signal; and the hysteresis trigger level of the comparator is greater than an amplitude of any fluctuation on the electroluminescence sensing signal during operation of the circuit, and a value of the threshold voltage plus the hysteresis trigger level is lower than a value of the electroluminescence sensing signal triggered when there is electroluminescence in the switch transistor in the circuit.

The transimpedance amplifier and the differential amplifier are both TI OPA818 with a high bandwidth of 2.7 GHz. A gain of the transimpedance amplifier is $5\times10^4$; and a gain of the differential amplifier is 4.4.

Considering such tradeoff in the converter and a viable auxiliary power supply, in this specification, a bias voltage Vbias is 34 V, and an overvoltage 5 V higher than a breakdown voltage of the silicon photomultiplier is provided. This generates low 50 mV dark current noise observed in a darkroom.

Therefore, in this specification, a 0.4 V threshold voltage Vth, corresponding to a 1.5 A diode on-state current, is conservatively preset for the comparator, to eliminate effects of all noise sources, increase a signal-to-noise ratio, and maintain high sensitivity of EL detection, thereby avoiding an excessive on-state current.

Figure 5:
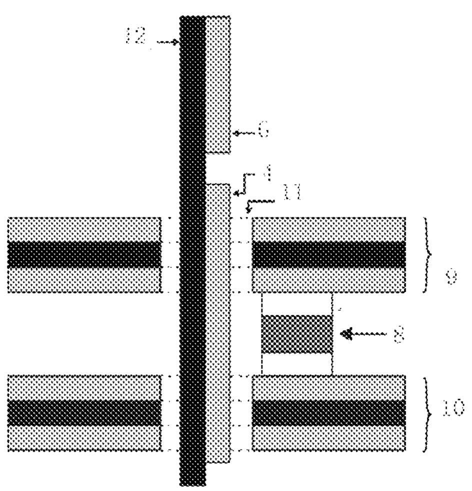
FIG. 5 is a cross-sectional diagram of a signal acquisition circuit inserted in a groove of a power module of an embedded printed circuit board.

As shown in FIG. 5, an embedded printed circuit board power assembly structure for detecting electroluminescence in a switch transistor in a circuit for the circuit adaptive zero-voltage switching control method includes a top printed circuit board and a bottom printed circuit board, where a to-be-detected switch transistor die in the circuit that needs to be controlled by using the circuit adaptive zero-voltage switching control method is disposed between the top printed circuit board and the bottom printed circuit board, a groove is provided at a position that is close to the to-be-detected switch transistor die and that is on each of the top printed circuit board and the bottom printed circuit board, and a printed circuit board of the electroluminescence detection circuit is inserted in the groove, so that the first silicon photomultiplier in the first signal receiving and amplifying assembly faces the to-be-detected switch transistor die.

The switch transistor die and the first silicon photomultiplier in the electroluminescence detection circuit are encapsulated in the same power module; and if the switch transistor die is a vertical device, the first silicon photomultiplier is vertically disposed on a side of the switch transistor die; or if the switch transistor die is a lateral device, the first silicon photomultiplier is parallelly disposed on top of the switch transistor die.

Proximity of current conduction paths between the top printed circuit board and the bottom printed circuit board provides tightly coupled magnetic flux. This provides extremely low power loop stray inductance for quick switching of SiC MOSFET.

To describe the provided adaptive zero-voltage switching (ZVS) method, a synchronous buck converter with rated power of 5 kW is constructed using two SiC MOSFET dies (with a rated voltage 750 V; Rds, on 14.4 mΩ) and one customized printed circuit board embedded power assembly. The converter has an input voltage of 400 V, an output voltage of 200 V, and an inductance of 25 μH. An electroluminescence detection circuit is inserted in a groove near an upper bridge arm MOSFET Q1 to detect electroluminescence in the upper bridge arm MOSFET Q1 and further determine switching status of the upper bridge arm MOSFET Q1. The TMS320F28379D is used as a controller to adjust switching frequency fsw in a next switching cycle based on the detected switching status in a current cycle. As a sensing circuit and a printed circuit board embedded module are not encapsulated in this experiment, the entire testing device is placed in a darkroom to eliminate ambient light noise.

Figure 6:
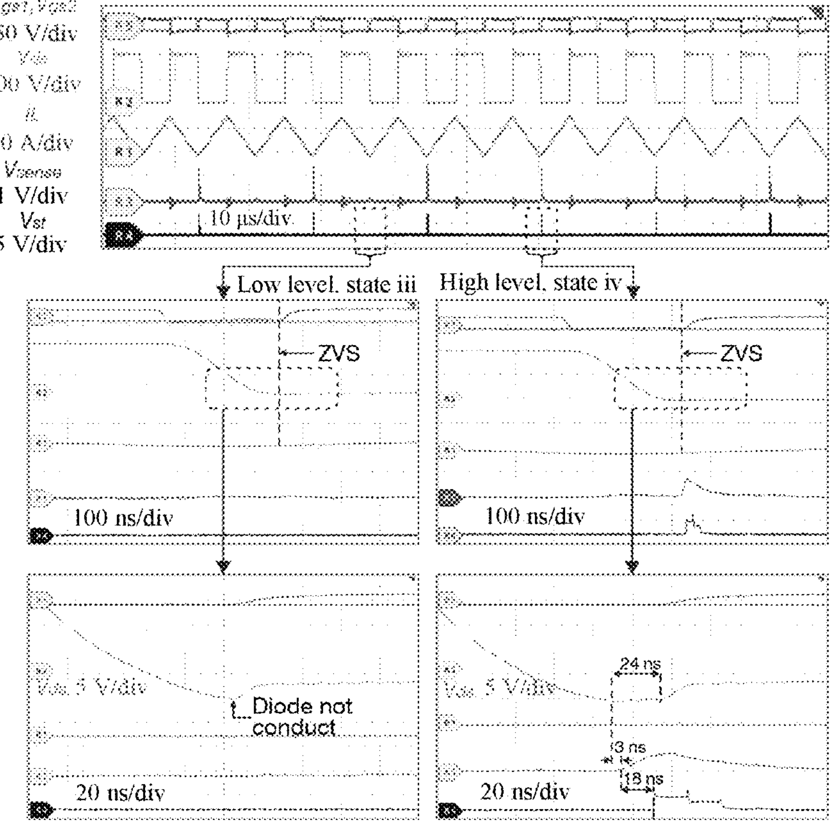
FIG. 6 shows waveforms of zero-voltage switching (ZVS) results achieved adaptively in a steady state.

FIG. 6 shows a drain-source voltage Vds of a switch transistor Q1, an inductor current iL, an analog signal Vsense, a digital signal Vst, a gate-source voltage Vgs1 of an upper bridge arm MOSFET Q1, and a gate-source voltage Vgs2 of a lower bridge arm MOSFET Q2 in steady-state operation at 50% rated power when adaptive zero-voltage switching (ZVS) control is enabled. It can be learned that the analog signal Vsense has a pulse every other cycle, and the digital signal Vst provides a low-noise signal to correspondingly indicate switching status. The results show that switching frequency fsw is automatically adjusted to ensure that the upper bridge arm MOSFET Q1 is on at or just before an on-state moment of a body diode, that is, at a boundary between state iii and state iv, to implement optimal zero-voltage switching (ZVS) operation.

In an enlarged view of the state iii, it can be observed that zero-voltage switching (ZVS) is perfectly implemented. Given the further enlarged drain-source voltage Vds, within dead time, the drain-source voltage Vds drops to zero as an output capacitor Coss is charged reversely, but does not reach an on-state voltage of the body diode. Therefore, the algorithm can accurately control the switch transistor to be in an optimal ZVS interval. In addition, as shown in an enlarged view of the state iv, zero-voltage switching (ZVS) is still implemented in this state, and the analog signal Vsense and the digital signal Vst have corresponding response actions. In a further enlarged view, the output capacitor Coss is charged reversely to the on-state voltage of the body diode, and then the body diode is on for 24 ns. It is observed that the drain-source voltage Vds has a small negative horizontal line. The conduction time 24 ns is very short, so an increase of the inductor current iL may be omitted. Therefore, in this solution, a valley current may be consistently controlled to 2 A, which is an accurate value for implementing optimal zero-voltage switching (ZVS).

The high bandwidth of the silicon photomultiplier (SiPM) and the operational amplifier provides delay time 3 ns from an on state to the start of a response of the analog signal Vsense. In addition, mainly due to a conservatively preset threshold voltage Vth of the comparator, delay time from the response of the analog signal Vsense to the trigger of the digital signal Vst is 18 ns, which is also included in 2.5 ns of propagation delay of the comparator. Therefore, considering that switching frequency fsw of most power electronic devices does not exceed 10 MHz, a total response speed is sufficient for the DSP to adjust fsw within a next cycle.

Figure 7:
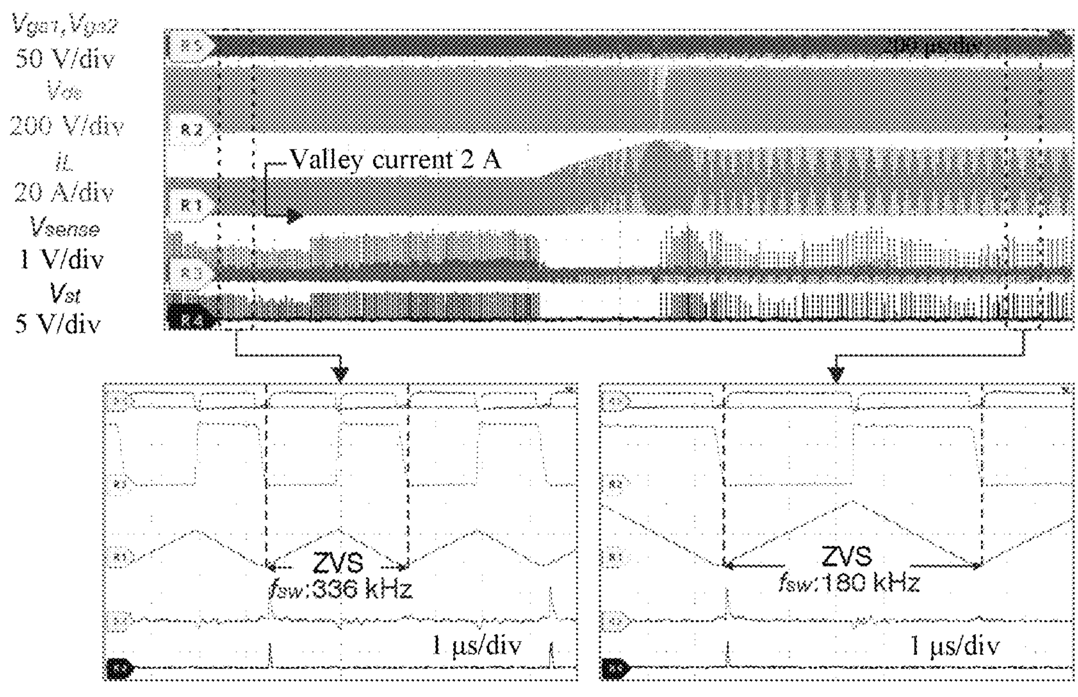
FIG. 7 shows waveforms during a load jumping from 10% to 50%.
Figure 8:
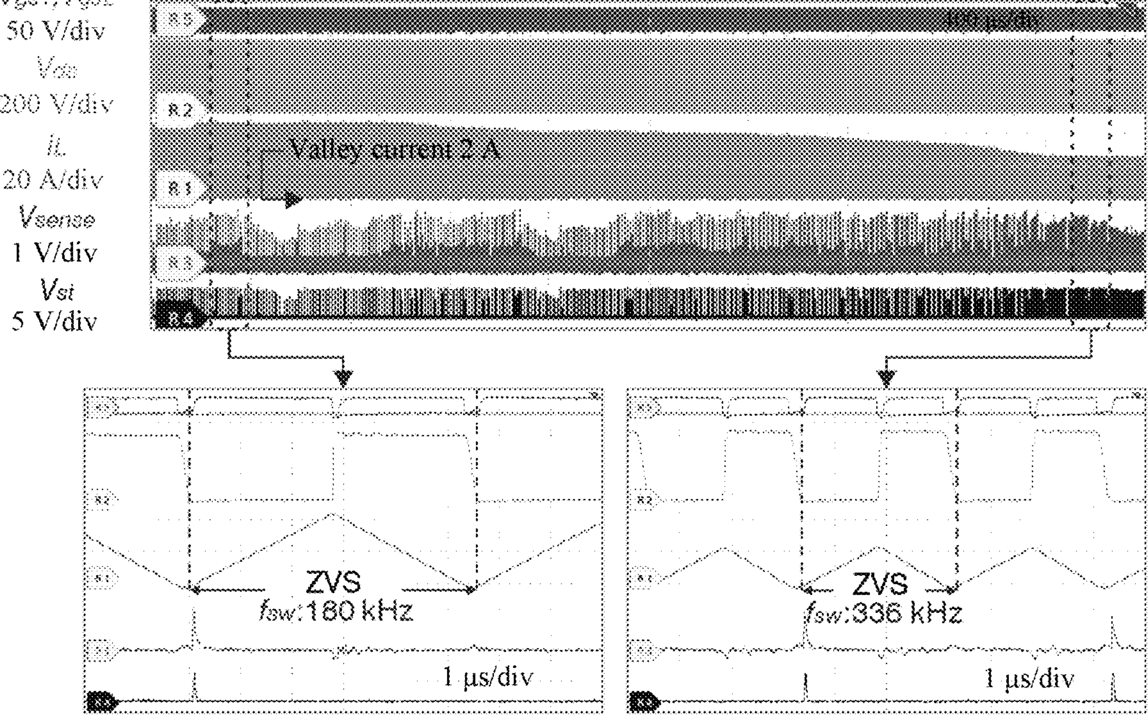
FIG. 8 shows waveforms during a load jumping from 50% to 10%.

Adaptive zero-voltage switching (ZVS) results under transient-state loading are shown as follows:

FIG. 7 and FIG. 8 respectively show a transient-state process in which a load jumps from rated power 10% to 50% and a transient-state process in which a load jumps from 50% to 10%. The method provided in this specification can automatically adapt to a new load current and adjust switching frequency fsw to implement zero-voltage switching.

Enlarged views of waveforms in the same time scale show that the provided control method can adaptively update switching frequency fsw of optimal zero-voltage switching (ZVS) when a load changes. During load increasing and decreasing, a controller adjusts switching frequency fsw to 180 kHz and 336 kHz respectively under a 50% load and a 10% load. The adjustment is performed automatically without any prerequisite table lookup or calculation. Optimal zero-voltage switching (ZVS) may be implemented consistently or may be checked by observing a constant 2 A valley current at a high load and a low load, because the valley current required for zero-voltage switching (ZVS) is load independent but determined only by a power device.

The foregoing embodiments are merely exemplary descriptions of principles and effects of the present invention and some applied embodiments, are not intended to limit the present invention. It should be noted that several transformations and improvements may be made by a person of ordinary skill in the art without departing from the concept of the present invention. These transformations and improvements fall within the protection scope of the present invention.

What is claimed is:

1. A circuit adaptive zero-voltage switching control method, comprising: disposing an opto-sensor to detect whether there is electroluminescence in a switch transistor in a circuit; if the disposed opto-sensor does not detect, within a current switching cycle of the circuit, an electroluminescent photon in a body diode (parasitic diode) or an anti-parallel freewheeling diode of the switch transistor that needs to be controlled, reducing switching frequency fsw of the circuit by a variable Δfsw within a next switching cycle, to increase an amplitude of a reverse inductor current, and continuously detecting whether there is electroluminescence; and if there is still no electroluminescence detected, continuously reducing the switching frequency by the variable Δfsw within each next switching cycle, and continuously detecting whether there is electroluminescence, until the disposed opto-sensor detects electroluminescence to reach a steady operating state; or if the disposed opto-sensor detects, within a current switching cycle of the circuit, an electroluminescent photon in a body diode (parasitic diode) or an anti-parallel freewheeling diode of the switch transistor that needs to be controlled, increasing switching frequency fsw by a variable Δfsw within a next switching cycle, and continuously detecting whether there is electroluminescence; and if there is still electroluminescence detected, continuously increasing the switching frequency by the variable Δfsw within each next switching cycle, and continuously detecting whether there is electroluminescence, until the disposed opto-sensor detects no electroluminescence to reach a steady operating state; and repeatedly increasing and reducing the switching frequency of the circuit by the variable Δfsw within successive switching cycles after reaching the steady operating state, wherein electroluminescence occurs at intervals of the successive switching cycles, for the circuit to reach an adaptive zero-voltage switching operating state;

the variable Δfsw is any value not greater than a difference between switching frequency fsw ii and switching frequency fsw iii; the switching frequency fsw ii is switching frequency when an output capacitor of the switch transistor that needs to be controlled in the circuit is just discharged to zero within dead time, at this time an optimal zero-voltage switching interval starts; and the switching frequency fsw iii is switching frequency when the switch transistor that needs to be controlled in the circuit is reversely charged at both ends to an on-state voltage of the body diode or the anti-parallel diode within the dead time, at this time the optimal zero-voltage switching interval ends.

2. A detection circuit for detecting electroluminescence in a switch transistor in a circuit for the circuit adaptive zero-voltage switching control method according to claim 1, comprising a first signal receiving and amplifying assembly and a second signal receiving and amplifying assembly that are disposed in parallel, wherein the two signal receiving and amplifying assemblies are connected to a differential amplifier, an output of the differential amplifier is connected to a comparator, an output of the comparator is connected to a digital signal processor, the first signal receiving and amplifying assembly comprises a first silicon photomultiplier and a first transimpedance amplifier, the second signal receiving and amplifying assembly comprises a second silicon photomultiplier and a second transimpedance amplifier, the first signal receiving and amplifying assembly is close to a to-be-detected switch transistor die in a power module of an embedded printed circuit board and is configured to sense electroluminescence, and the second signal receiving and amplifying assembly is located outside an electroluminescence transmission region to eliminate potential noise caused by ambient light and electromagnetic interference (EMI).

3. The detection circuit for detecting electroluminescence in a switch transistor in a circuit for the circuit adaptive zero-voltage switching control method according to claim 2, wherein a threshold voltage and a hysteresis trigger level need to be set for the comparator, and the threshold voltage is higher than a sum of noise caused by all sources on an electroluminescence sensing signal; and the hysteresis trigger level of the comparator is greater than an amplitude of any fluctuation on the electroluminescence sensing signal during operation of the circuit, and a value of the threshold voltage plus the hysteresis trigger level is lower than a value of the electroluminescence sensing signal triggered when there is electroluminescence in the switch transistor in the circuit.

4. The detection circuit for detecting electroluminescence in a switch transistor in a circuit for the circuit adaptive zero-voltage switching control method according to claim 3, wherein a gain of the transimpedance amplifier is $5\times10^4$; and a gain of the differential amplifier is 4.4.

5. The detection circuit for detecting electroluminescence in a switch transistor in a circuit for the circuit adaptive zero-voltage switching control method according to claim 4, wherein the transimpedance amplifier and the differential amplifier are both TI OPA818 with a high bandwidth of 2.7 GHz.

6. An embedded printed circuit board power assembly structure for detecting electroluminescence in a switch transistor in a circuit for the circuit adaptive zero-voltage switching control method according to claim 2, comprising a top printed circuit board and a bottom printed circuit board, wherein a to-be-detected switch transistor die in the circuit that needs to be controlled by using the circuit adaptive zero-voltage switching control method is disposed between the top printed circuit board and the bottom printed circuit board, a groove is provided at a position that is close to the to-be-detected switch transistor die and that is on each of the top printed circuit board and the bottom printed circuit board, and a printed circuit board of the electroluminescence detection circuit is inserted in the groove, so that the first silicon photomultiplier in the first signal receiving and amplifying assembly faces the to-be-detected switch transistor die.

7. The embedded printed circuit board power assembly structure for detecting electroluminescence in a switch transistor in a circuit for the circuit adaptive zero-voltage switching control method according to claim 6, wherein the switch transistor die and the first silicon photomultiplier in the electroluminescence detection circuit are encapsulated in the same power module; and if the switch transistor die is a vertical device, the first silicon photomultiplier is vertically disposed on a side of the switch transistor die; or if the switch transistor die is a lateral device, the first silicon photomultiplier is parallelly disposed on top of the switch transistor die.

8. An embedded printed circuit board power assembly structure for detecting electroluminescence in a switch transistor in a circuit for the circuit adaptive zero-voltage switching control method according to claim 3, comprising a top printed circuit board and a bottom printed circuit board, wherein a to-be-detected switch transistor die in the circuit that needs to be controlled by using the circuit adaptive zero-voltage switching control method is disposed between the top printed circuit board and the bottom printed circuit board, a groove is provided at a position that is close to the to-be-detected switch transistor die and that is on each of the top printed circuit board and the bottom printed circuit board, and a printed circuit board of the electroluminescence detection circuit is inserted in the groove, so that the first silicon photomultiplier in the first signal receiving and amplifying assembly faces the to-be-detected switch transistor die.

9. An embedded printed circuit board power assembly structure for detecting electroluminescence in a switch transistor in a circuit for the circuit adaptive zero-voltage switching control method according to claim 4, comprising a top printed circuit board and a bottom printed circuit board, wherein a to-be-detected switch transistor die in the circuit that needs to be controlled by using the circuit adaptive zero-voltage switching control method is disposed between the top printed circuit board and the bottom printed circuit board, a groove is provided at a position that is close to the to-be-detected switch transistor die and that is on each of the top printed circuit board and the bottom printed circuit board, and a printed circuit board of the electroluminescence detection circuit is inserted in the groove, so that the first silicon photomultiplier in the first signal receiving and amplifying assembly faces the to-be-detected switch transistor die.

10. An embedded printed circuit board power assembly structure for detecting electroluminescence in a switch transistor in a circuit for the circuit adaptive zero-voltage switching control method according to claim 5, comprising a top printed circuit board and a bottom printed circuit board, wherein a to-be-detected switch transistor die in the circuit that needs to be controlled by using the circuit adaptive zero-voltage switching control method is disposed between the top printed circuit board and the bottom printed circuit board, a groove is provided at a position that is close to the to-be-detected switch transistor die and that is on each of the top printed circuit board and the bottom printed circuit board, and a printed circuit board of the electroluminescence detection circuit is inserted in the groove, so that the first silicon photomultiplier in the first signal receiving and amplifying assembly faces the to-be-detected switch transistor die.

11. The embedded printed circuit board power assembly structure for detecting electroluminescence in a switch transistor in a circuit for the circuit adaptive zero-voltage switching control method according to claim 8, wherein the switch transistor die and the first silicon photomultiplier in the electroluminescence detection circuit are encapsulated in the same power module; and if the switch transistor die is a vertical device, the first silicon photomultiplier is vertically disposed on a side of the switch transistor die; or if the switch transistor die is a lateral device, the first silicon photomultiplier is parallelly disposed on top of the switch transistor die.

12. The embedded printed circuit board power assembly structure for detecting electroluminescence in a switch transistor in a circuit for the circuit adaptive zero-voltage switching control method according to claim 9, wherein the switch transistor die and the first silicon photomultiplier in the electroluminescence detection circuit are encapsulated in the same power module; and if the switch transistor die is a vertical device, the first silicon photomultiplier is vertically disposed on a side of the switch transistor die; or if the switch transistor die is a lateral device, the first silicon photomultiplier is parallelly disposed on top of the switch transistor die.

13. The embedded printed circuit board power assembly structure for detecting electroluminescence in a switch transistor in a circuit for the circuit adaptive zero-voltage switching control method according to claim 10, wherein the switch transistor die and the first silicon photomultiplier in the electroluminescence detection circuit are encapsulated in the same power module; and if the switch transistor die is a vertical device, the first silicon photomultiplier is vertically disposed on a side of the switch transistor die; or if the switch transistor die is a lateral device, the first silicon photomultiplier is parallelly disposed on top of the switch transistor die.

* * * * *